United States Patent
Kubota et al.

(10) Patent No.: US 10,396,898 B2
(45) Date of Patent: Aug. 27, 2019

(54) OPTICAL MODULE AND OPTICAL TRANSMITTING APPARATUS INSTALLING A NUMBER OF OPTICAL MODULES

(71) Applicant: SUMITOMO ELECTRIC DEVICE INNOVATIONS, INC., Yokohama-shi (JP)

(72) Inventors: Shuichi Kubota, Yokohama (JP); Masahiro Hirayama, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 15/800,255

(22) Filed: Nov. 1, 2017

(65) Prior Publication Data
US 2018/0123697 A1 May 3, 2018

(30) Foreign Application Priority Data

Nov. 1, 2016 (JP) ................. 2016-214464

(51) Int. Cl.
*H04B 10/04* (2006.01)
*H04B 10/516* (2013.01)
(Continued)

(52) U.S. Cl.
CPC ....... *H04B 10/516* (2013.01); *G02B 19/0009* (2013.01); *G02B 19/0028* (2013.01);
(Continued)

(58) Field of Classification Search
CPC ............... H04B 10/516; H04B 10/501; G02B 19/0009; G02B 19/0028; G02B 19/0057;
(Continued)

(56) References Cited

U.S. PATENT DOCUMENTS 7,116,917 B2 * 10/2006 Miyamoto ......... H04B 10/5051
398/185
7,144,788 B2 * 12/2006 Kihara ................ G02B 6/4201
438/313
(Continued)

FOREIGN PATENT DOCUMENTS

JP          H5327031 A     12/1993

*Primary Examiner* — Hibret A Woldekidan
(74) *Attorney, Agent, or Firm* — Baker Botts LLP; Michael A. Satori

(57) ABSTRACT

An optical module installed within an optical transmitter apparatus is disclosed. The optical module provides an electrically insulating carrier, a semiconductor element, and a capacitor. The carrier provides a ground pattern and a bias pad. The ground pattern mounts the capacitor and the semiconductor element thereon. The bias pad is electrically isolated from the ground pattern thereby forming a parasitic capacitor against the ground pattern. The optical module further includes at least two bonding wires among a first bonding wire connecting the semiconductor element with the bias pad, a second bonding wire connecting the bias pad with the capacitor, and an additional bonding wire connecting the capacitor with the semiconductor element. The semiconductor element is supplied with a bias current through the at least two bonding wires.

9 Claims, 17 Drawing Sheets

(51) Int. Cl.
*G02B 19/00* (2006.01)
*G02B 27/28* (2006.01)
*G02B 27/30* (2006.01)
*H01S 5/022* (2006.01)
*H01S 5/068* (2006.01)
*H01S 5/00* (2006.01)
*H01S 5/042* (2006.01)
*G02B 6/42* (2006.01)

(52) U.S. Cl.
CPC ....... *G02B 19/0057* (2013.01); *G02B 27/283* (2013.01); *G02B 27/30* (2013.01); *H01S 5/02276* (2013.01); *H01S 5/06808* (2013.01); *G02B 6/4206* (2013.01); *G02B 6/4214* (2013.01); *G02B 6/4246* (2013.01); *G02B 6/4292* (2013.01); *H01S 5/0078* (2013.01); *H01S 5/02236* (2013.01); *H01S 5/02284* (2013.01); *H01S 5/0427* (2013.01); *H01S 2301/02* (2013.01)

(58) Field of Classification Search
CPC .... G02B 27/283; G02B 27/30; G02B 6/4206; G02B 6/4214; G02B 6/4246; G02B 6/4292; H01S 5/02276; H01S 5/06808; H01S 5/0078; H01S 5/02236; H01S 5/02284; H01S 5/0427; H01S 2301/02

USPC ................ 398/68, 79, 85, 88, 164, 182, 183
See application file for complete search history.

(56) References Cited

U.S. PATENT DOCUMENTS

| | | | | |
|---|---|---|---|---|
| 7,457,333 | B2* | 11/2008 | Moto | H01S 5/02216 |
| | | | | 372/36 |
| 8,346,037 | B2* | 1/2013 | Pezeshki | G02B 6/32 |
| | | | | 385/35 |
| 8,830,552 | B2* | 9/2014 | Hirayama | H01S 5/0265 |
| | | | | 333/33 |
| 9,054,485 | B1* | 6/2015 | Ng | H01S 5/042 |
| 9,385,830 | B2* | 7/2016 | Sato | H04J 14/02 |
| 10,193,633 | B2* | 1/2019 | Kubota | G02B 6/4206 |
| 2005/0156187 | A1* | 7/2005 | Isokawa | H01L 23/49838 |
| | | | | 257/100 |
| 2009/0003398 | A1* | 1/2009 | Moto | H01S 5/02216 |
| | | | | 372/36 |
| 2011/0222567 | A1* | 9/2011 | Scofet | H01S 5/02212 |
| | | | | 372/36 |
| 2013/0106528 | A1* | 5/2013 | Christian | H05K 1/0251 |
| | | | | 333/33 |
| 2017/0310078 | A1* | 10/2017 | Hirayama | H01S 5/0265 |
| 2018/0123695 | A1* | 5/2018 | Kubota | G02B 6/4206 |

* cited by examiner

OPTICAL MODULE AND OPTICAL TRANSMITTING APPARATUS INSTALLING A NUMBER OF OPTICAL MODULES

CROSS REFERENCE TO RELATED APPLICATIONS

The present application claims the benefit of priority of Japanese Patent Application No. 2016-214464, filed on Nov. 1, 2016, which is incorporated herein by reference. The present application is closely related to the commonly-assigned U.S. patent application Ser. No. 15/497,855 entitled: OPTICAL TRANSMITTER PROVIDING COPLANAR LINE ON CARRIER, which is also incorporated by reference.

BACKGROUND

1. Field of the Invention

The present invention relates to an optical module and an optical transmitting apparatus that installs a number of optical modules.

2. Related Background Arts

A Japanese Patent Application laid open No. JP-II05-327013A has disclosed an optical transmitter apparatus implementing a laser diode, an optical system that outputs laser light generated by the laser diode to an outside of the apparatus, and a photodiode that monitors a portion of the laser light. In a conventional optical transmitting apparatus, a semiconductor laser diode (LD) is often mounted on a carrier that provides in a top surface thereof a signal line and a ground pattern. The LD is mounted on the ground pattern such that a back electrode thereof, which may be a cathode electrode, is grounded through the ground pattern. The LD in a top electrode, which may be an anode electrode, receives a bias current through a bonding wire. Such a conventional optical module sometimes implements a capacitor between a path for supplying the bias current and the ground. An optical module may be formed in compact by mounting the capacitor on the ground pattern. However, only a signal capacitor on the ground pattern sometimes becomes insufficient for suppressing or eliminating noises superposed on the bias supplying path in a wide frequency range. When the ground pattern mounts additional capacitors, the carrier is necessary to be enlarged, which raises a barrier against a stream to make components compact.

SUMMARY

An aspect of the present invention relates to an optical module that generates a modulated optical beam. The optical module includes an electrically insulating carrier, a semiconductor element, and a capacitor. The carrier provides a ground pattern and a bias pad on a top surface thereof. The bias pad is electrically isolated from the ground pattern thereby forming a parasitic capacitor against the ground pattern. The semiconductor element is mounted on the ground pattern and generates the modulated optical beam by being supplied with a bias current. The capacitor is also mounted on the ground pattern. The optical module further includes at least two bonding wires among a first bonding wire that connects the semiconductor element with the bias pad, a second bonding wire that connects the bias pad with the capacitor, and an additional bonding wire that connects the capacitor with the semiconductor element. Thus, the bias current is supplied to the semiconductor element through the at least two bonding wires.

Another aspect of the present invention relates to an optical transmitter apparatus that generates a multiplexed optical beam that multiplexes a number of modulated beams. The optical transmitter apparatus of the invention includes the number of optical modules and an optical multiplexing system. The optical modules each include an electrically insulating carrier, a semiconductor element and a capacitor. The carrier provides a ground pattern and a bias pad on a top surface thereof. The bias pad is electrically isolated from the ground pattern thereby forming a parasitic capacitor against the ground pattern. The semiconductor element is mounted on the ground pattern and generates the modulated optical beam supplied with a bias current. The capacitor is also mounted on the ground pattern. The optical module further includes at least two bonding wires among a first bonding wire that connects the semiconductor element with the bias pad, a second bonding wire that connects the bias pad with the capacitor, and an additional bonding wire that connects the capacitor with the semiconductor element. Thus, the bias current is supplied to the semiconductor element through the at least two bonding wires. The optical multiplexing system multiplexes the modulated optical beams each generated in the optical modules into the multiplexed optical beam.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, embodiment according to the present invention will be described as referring to accompanying drawings. In the description of the drawings, numerals or symbols same with or similar to each other will refer to elements same with or similar to each other without duplicating explanations.

Figure 1:
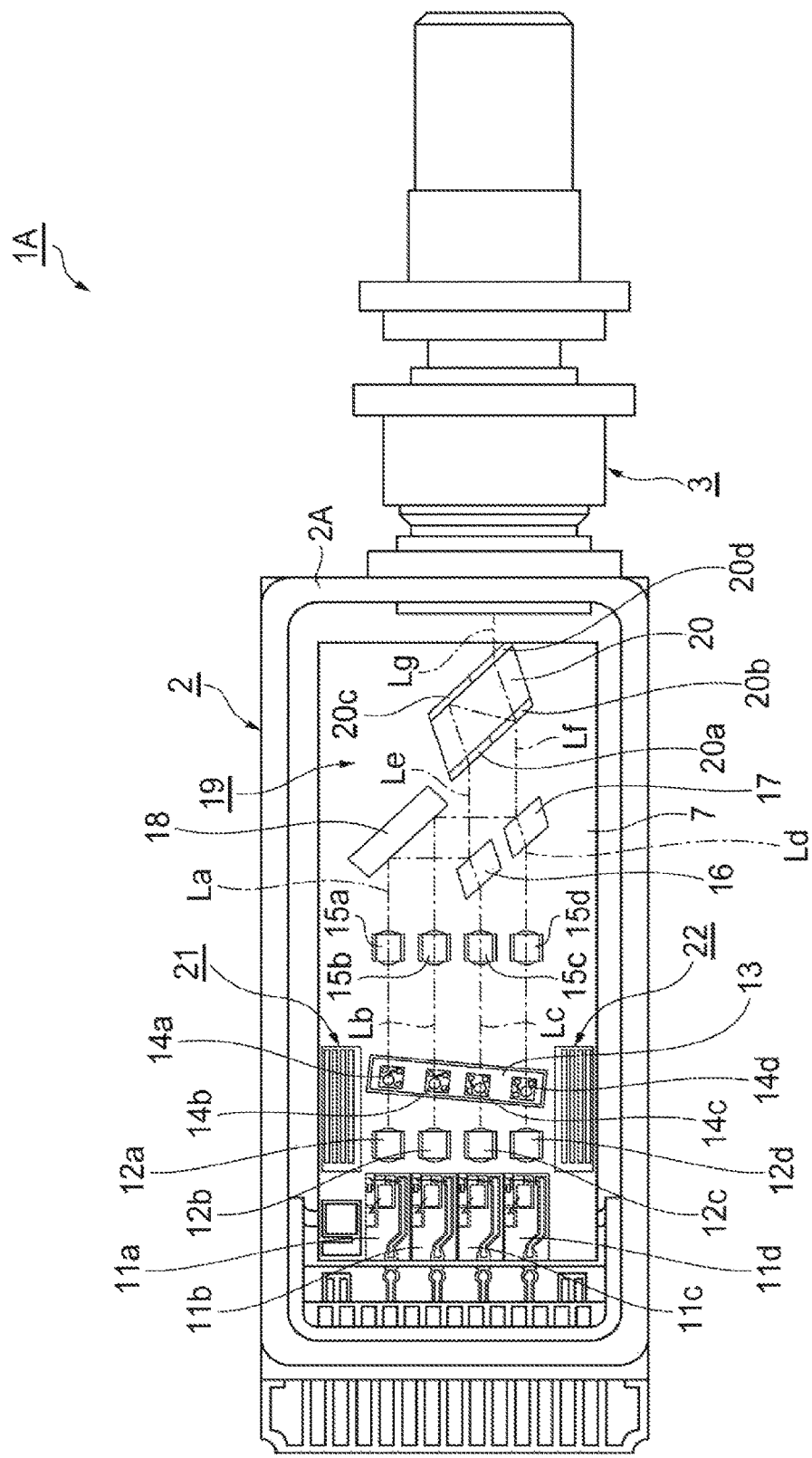
FIG. 1 is a plan view showing an inside of an optical transmitter apparatus according to the first embodiment of the present invention.
Figure 2:
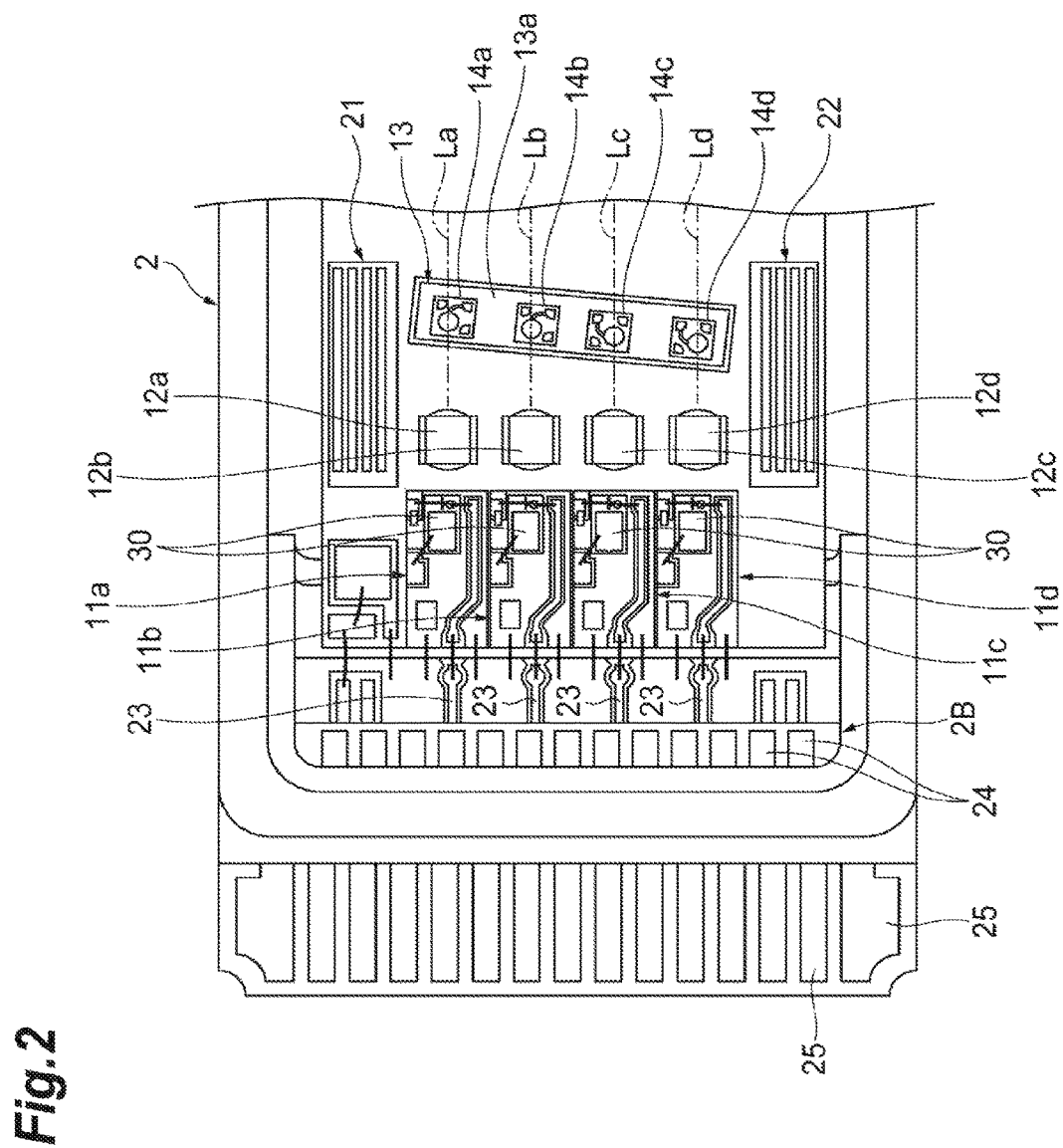
FIG. 2 magnifies a rear portion of the inside of the optical transmitter apparatus shown in FIG. 1.
Figure 3:
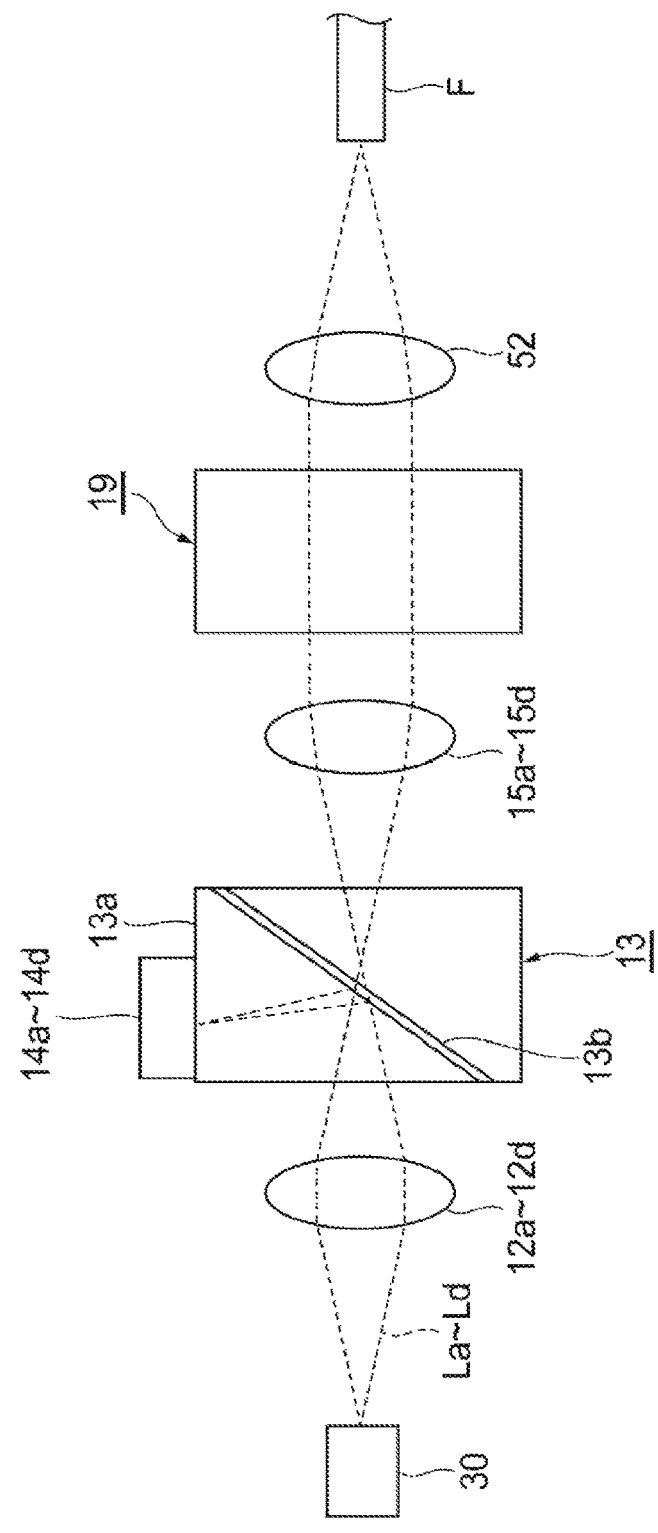
FIG. 3 schematically illustrates an optical coupling system in the optical transmitter apparatus shown in FIG. 1.

FIG. 1 is a plan view showing an inside of an optical transmitter apparatus 1A according to the first embodiment of the present invention; FIG. 2 magnifies a rear portion of the inside of the optical transmitter apparatus 1A shown in FIG. 1; and FIG. 3 schematically illustrates an optical coupling system in the optical transmitter apparatus shown in FIG. 1. The optical transmitter apparatus 1A provides a box-shaped housing 2 and an optical coupling unit 3 with a cylindrical shape, where the optical transmitting apparatus 1A is sometimes called as a transmitter optical sub-assembly (TOSA).

The optical transmitter apparatus 1A may implement an N-count of optical modules, 11a to 11d, where N is an integer equal to or greater than 2, the N-count of first lenses, 12a to 12d, a beam splitter (BS) 13, the N-count of semiconductor light-receiving devices, typically semiconductor photodiodes (PDs), 14a to 14d, the N-count of second lenses, 15a to 15d, an optical multiplexing system 19, and circuit boards, 21 and 22. In the present embodiment, the optical transmitter apparatus 1A provides four (4) lanes of signal channels, which means that the N-count is equal to four (4). The optical modules, 11a to 11d, the first lenses, 12a to 12d, the BS 13, the second lenses, 15a to 15d, the optical multiplexing system 19, and the circuit boards, 21 and 22, are mounted on a plane surface of the base 7.

The housing 2 provides a feedthrough 2B in a rear wall of the housing 2. In the description below, a direction of forward and/or front corresponds to a side where the coupling unit 3 is provided with respect to the housing 2, while, another direction of rear and/or back corresponds to a side where the feedthrough 2B is provided. However, those directions are distinguished only for the explanation sake, and could not affect the scope of the present invention. The feedthrough 2B, which passes the rear wall of the housing 2, provides a rear portion outside of the housing 2 where terminals 25 are provided for communicating with external apparatuses, and arranged in an array. The feedthrough 2B in a portion inside of the rear wall provides internal terminals 24 and the N-count of signal lines 23 that form co-planar transmission lines. The N-count of signal lines 23 and the internal terminals 24 are connected to the external terminals 25.

The optical transmitter apparatus 1A drives the optical modules, 11a to 11d, independently, which means that the optical modules, 11a to 11d, operable as optical sources may generate signal beams, La to Ld, independently. The signal beams, La to Ld, in optical axes thereof extend substantially parallel along a longitudinal direction of the housing 2. Driving signals for the optical modules, 11a to 11d, are supplied from an outside of the housing 2 through the terminals, 24 and 25, and the signal lines 23. The signal beams, La to Ld, are modulated in amplitudes thereof by the driving signals. The optical modules, 11a to 11d, each provide semiconductor elements that integrate semiconductor laser diodes (LDs) with semiconductor modulators. The optical modules, 11a to 11d, exactly, the semiconductor elements 30 in the optical modules, 11a to 11d, may generate the signal beams, La to Ld, whose wavelengths are within a 1.3 µm band but different from each other.

The first lenses, 12a to 12d, which are optical coupled with the optical modules, 11a to 11d, may convert the divergent beams, La to Ld, into convergent beams. That is, distances between semiconductor elements 30 in the optical modules, 11a to 11d, and the first lenses, 12a to 12d, corresponding to the semiconductor elements 30 are set longer than focal lengths of the first lenses, 12a to 12d. Accordingly, the first lenses, 12a to 12d, may convert the divergent beams, La to Ld, into the convergent beams, as schematically shown in FIG. 3.

The BS 13, which has a rectangular block shape with a longitudinal direction perpendicular to the optical axes of the signal beams, La to Ld, is disposed between the first lenses, 12a to 12d, and the second lenses, 15a to 15d. The BS 13, as shown in FIG. 3, provides a multi-layered dielectric film 13b between two triangular blocks, where the multi-layered dielectric film 13b in a normal thereof is inclined with the optical axes of the signal beams, La to Ld. The multi-layered dielectric film 13b may reflect portions of the signal beams, La to Ld, as monitored beams toward the PDs, 14a to 14d, mounted on the top surface 13a of the BS 13 by ratios of 5 to 10%. The PDs, 14a to 14d, may receive the monitored beams and generate photocurrents corresponding to optical power of the signal beams, La to Ld. The PDs, 14a to 14d, are mounted on the BS 13 such that back surfaces thereof face and are in contact with the top surface 13a of the BS 13, where the PDs, 14a 14d, have optically sensitive layers closer to top surfaces thereof. That is, the PDs, 14a to 14d, have an arrangement of, what is called, the back illumination.

The second lenses, 15a to 15d, optically couple with the first lenses, 12a to 12d, through the BS 13. The signal beams, La to Ld, once form respective beam waists after passing the BS 13, diverge again, and enter the second lenses, 15a to 15d. The second lenses, 15a to 15d, are disposed so as to align focuses thereof with the positions of the beam waists. Accordingly, the signal beams, La to Ld, output from the second lense, 15a to 15d, becomes substantially collimated beams.

The optical multiplexing system 19, which optically couples with the second lenses, 15a to 15d, may generate a multiplexed beam Lg by multiplexing the signal beams, La to Ld. The optical multiplexing system 19 of the present embodiment provides a first wavelength division multiplexing (WDM) filter 16, a second WDM filter 17, a mirror 18, and a polarization beam combiner (PBC) 20. The mirror 18 optically couples with the second lenses, 15a and 15b; specifically, the mirror 18, which is disposed such that a reflecting surface thereof is positioned on and inclined with the optical axes of the two of the second lenses, 15a and 15b, reflects two of the signal beams, La and Lb, toward the WDM filters, 16 and 17. The first WDM filter 16, which optically couples with the third second lens 15c; specifically, the first WDM filter 16, which is disposed such that a wavelength selective surface thereof faces to and inclines from the optical axis of the third signal beam Lc and the optical axis of the mirror 18, transmits the signal beam Lc coming from the second lens 15c and reflects the signal beam La coming from the mirror 18 so as to align the optical axes of the two signal beams, La and Lc, and generate a first multiplexed beam Le. The second WDM filter 17 optically couples with the mirror 18 and the fourth second lens 15d.

Specifically, the WDM filter 17 is disposed such that the wavelength selective surface thereof faces to and inclines from the optical axis of the second signal beam Lb reflected by the mirror 18 and the fourth signal beam Ld coming from the fourth second lens 15d. Thus, the second WDM filter 17 reflects the signal beam Lb coming from the mirror 18 and transmits the signal beam Ld coming from the second lens 15d, which may align the optical axes of the two signal beams, Lb and Ld, to generate a second multiplexed beam Lf.

The PBC 20 has a transparent slab with an anti-reflection film 20a and a polarization combining film 20b in one surface thereof, and a reflection film 20c and another anti-reflection film 20d in another surface thereof. The first multiplexed beam Le coming from the first WDM filter 16 enters the former anti-reflection film 20a, reaches the reflection film 20c passing through the PBC 20, reflected thereby, and finally reaches the polarization combining film 20b. The second multiplexed beam Lf directly enters the polarization combining film 20b. One of the multiplexed beams, Le or Lf, passes, before entering the PBC 20, a half-wavelength plate ($\lambda/2$) that may rotate the polarization of the multiplexed beam by an angle of 90°, which is not shown in the figures. Accordingly, the multiplexed beams, Le and Lf, enter the polarization combining film 20b have respective polarizations perpendicular to each other. The polarization combining film 20b has a function such that a polarization component perpendicular to the incident plane is substantially reflected but substantially not transmitted, while, another polarization component parallel to the incident plane is substantially transmitted but substantially not reflected, where the incident plane may be formed by the optical axis of the incoming light and the normal of the polarization combining film 20b. Accordingly, the multiplexed beam Le having a polarization, for instance, parallel to a bottom of the housing 2 is almost reflected by the polarization combining film 20b but the other multiplexed beam Lf with a polarization perpendicular to the bottom of the housing 2 is almost transmitted through the polarization combining film 20b. Thus, two multiplexed beams, Le and Lf, are multiplexed by the PBC 20 and becomes the multiplexed beam Lg externally output from the optical transmitting apparatus 1A passing the anti-reflection film 20d and the window provided in the side 2A of the housing 2.

The coupling unit 3, which has the cylindrical shape, provides a third lens 52 and a fiber stub. The third lens 52 optically couples with the optical multiplexing system 19. The fiber stub secures a coupling fiber F shown in FIG. 3. The multiplexed beam Lg converges onto an end of the coupling fiber F by the third lens 52. The coupling unit 3 is fixed to the side 2A of the housing 2 after optically aligned with the optical axis of the multiplexed beam Lg. The optical coupling unit 3 may further include an optical isolator, which is not illustrated in the figures, that prevents incoming light from entering within the optical transmitting apparatus 1A.

Figure 4:
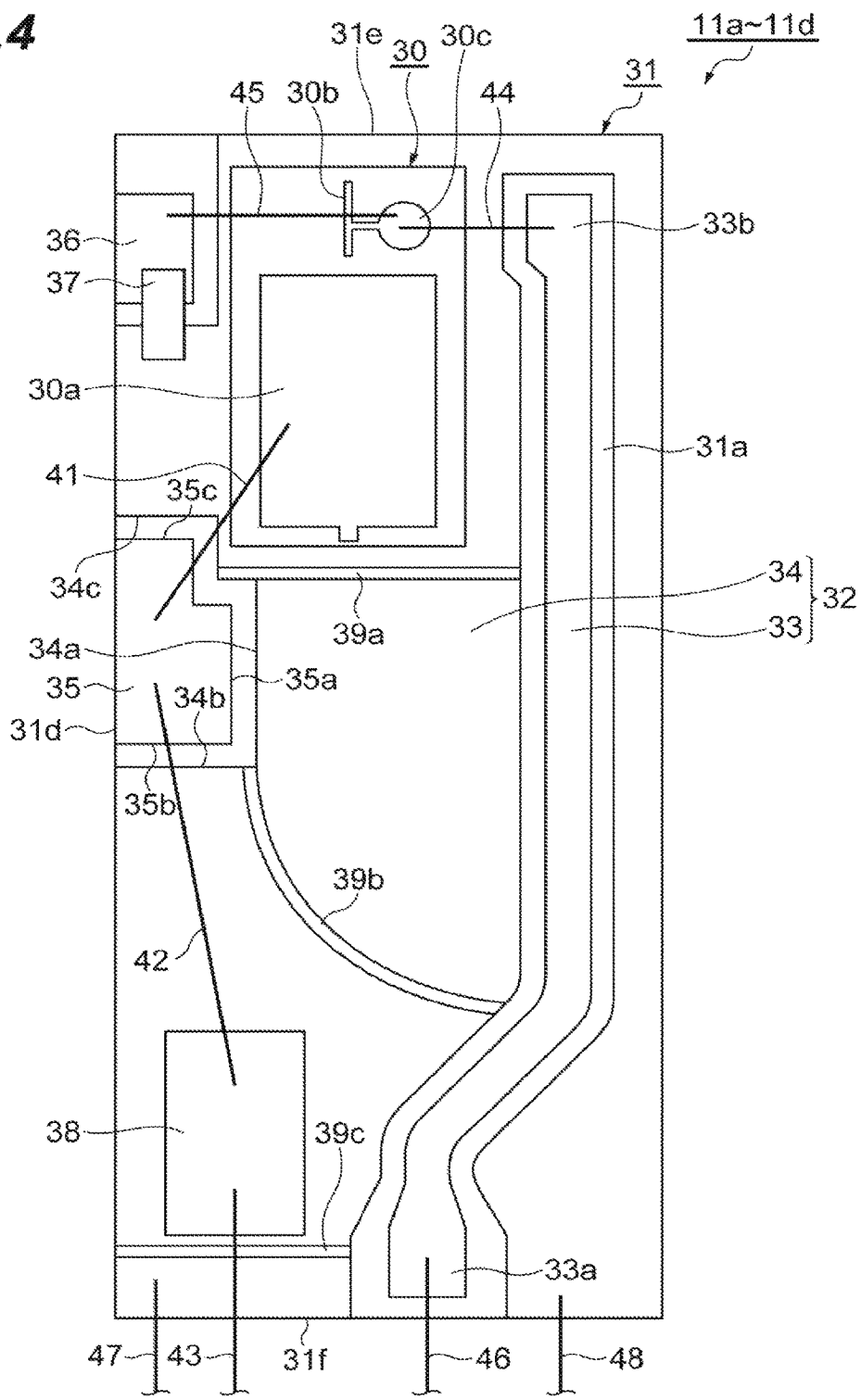
FIG. 4 is a plan view of an optical module implemented in the optical transmitter apparatus of FIG. 1.

Next, details of the optical modules, 11a to 11d, will be described. FIG. 4 is a plan view showing the optical modules, 11a to 11d, implemented within the optical transmitter apparatus shown in FIG. 1. Because the optical modules, 11a to 11d, have arrangements equal to each other, the explanation below concentrates on the optical module 11a, and the explanations below may be applicable to the other optical modules, 11b to 11d. The optical module 11a provides carrier 31 with a rectangular slab shape whose longitudinal direction extends along the optical axis of the signal beam La by a length shorter than 1 mm, where the present carrier 31 has the longitudinal length of 700 μm. The carrier 31, which provides a top surface 31a on which components described below are mounted, may be made of electrically insulating material.

The top surface 31a of the carrier 31 mounts a semiconductor element 30 and a capacitor 38, where the semiconductor element 30 may be a type of semiconductor laser diode (LD). The top surface 31a may further provide a co-planar line 32, a ground pattern 34, a bias pad 35, and a termination pad 36. Those elements, 30 to 36, are electrically connected with bonding wires, 41 to 48.

The semiconductor element 30 monolithically integrates a semiconductor laser diode (LD) with a semiconductor modulator on a semiconductor substrate common to the LD and the modulator. The LD provides pad 30a for an anode electrode thereof, while, the semiconductor modulator provides another pad 30c for an anode electrode 30b of the semiconductor modulator. The pad 30a supplies a bias current for driving the LD therethrough, while, the other pad 30c supplies a driving signal for the semiconductor modulator. Those pads, 30a and 30c, are formed by, for instance, plating gold (Au). The semiconductor element 30 is mounted on the ground pattern 34 with a solder, an electrically conductive resin and the like; specifically, in a peripheral portion of the ground pattern 34 closer to an edge 31e of the carrier 31. The semiconductor element 30 provides a back metal in a back surface thereof, where the back metal commonly extends in the LD and the semiconductor modulator and operates as a cathode electrode of the LD and the semiconductor modulator. Thus, the semiconductor element 30 in the cathode electrode thereof may be directly grounded.

The capacitor 38, which may be a type of die-capacitor having a top electrode and a bottom electrode, is mounted on the ground pattern 34 in a portion closer to a corner between the sides, 31d and 31f. The capacitor 34 in the bottom electrode thereof is in contact with the ground pattern 34 through solder, electrically conductive resin and the like to secure the electrical connection therebetween. The ground pattern 34 of the present embodiment provides mounds, 39a to 39c, to prevent the solder or the light from spreading. Specifically, the mound 39a demarcates the area for mounting the semiconductor element 30 from other areas to prevent the solder or the light from spreading toward the other areas. The mounds, 39b and 39c, that surrounds an area for mounting the die-capacitor 38 may prevent the solder or the like from spreading to the area for the semiconductor element 30. The mounds, 39a to 39c, may be made of metal such as an alloy of nickel and chromium (Cr), namely, NiCr, and has a step about 0.3 μm against the plated gold (Au).

The co-planar line 32, which extends along the longitudinal direction of the carrier 31, is connected in one end thereof to the semiconductor element 30 to supply the driving signal with a transmission speed of, for instance, 29 Gbps to the semiconductor modulator. Specifically, the co-planar line 32 constitutes a signal line 33 and the ground pattern 34 sandwiching the signal line 33. The signal line 33, which may be made of metal film, extends from one end 33a to the other end 33b, where both ends, 33a to 33b, form pads for bonding wires thereto. A bonding wire 44 connects one of the pads 33b with the pad 30c of the semiconductor modulator.

The ground pattern 34 covers the top surface 31a of the carrier 31 except for the signal line 33 of the co-planar line 32, the bias pad 35, and the termination pad 36. Thus, ground pattern 34 sandwiches the signal line 33 of the co-planar line 32 with a preset gap therebetween. Two bonding wires, 47 and 48, may electrically connect the ground pattern 34 with a ground pattern on the feedthrough 2B as sandwiching the bonding wires 43 and 46, for supplying the bias current and the driving signal to the semiconductor element 30.

The bias pad 35 is disposed a center along the longitudinal direction and closer to the side 31d of the carrier 31. The bias pad 35 is electrically isolated from the ground pattern 34 with a gap therebetween. Specifically, the bias pad provides an edge 35a extending along the longitudinal direction of the carrier 31 and two edges, 35b and 35c, extending along the lateral direction of the carrier 31. On the other hand, the ground pattern 34 provides edges, 34a to 34c, facing and extending parallel to the edges, 35a to 35c, of the bias pad 35, respectively. The gap between the bias pad 35 and the ground pattern 34 may be 20 to 40 µm. The present embodiment disposes the bias pad 35 along the side 31d of the carrier 31, but, the bias pad may be arranged inside of the carrier 31, that is, the bias pad 35 may be fully surrounded by the ground pattern 34.

The bonding wire 41, which is the first wire of the present embodiment, electrically connects the pad 30a on the LD with the bias pad 35. The bonding wire 42, which is the second wire of the present embodiment, electrically connects the bias pad 35 with the die-capacitor 38. The bonding wire 43, which is the third wire of the present embodiment, electrically connects the die-capacitor 38 with the inner terminal 24 on the feedthrough 2B shown in FIG. 2. The bias current for the LD is supplied from the external of the housing 2 through the bonding wires, 41 to 43.

In an alternative, an additional bonding wire, which is not illustrated in the figures, may connect the die-capacitor 38 with the pad 30a of the LD. In a still another alternative, a bonding wire directly connects the die-capacitor 38 with the pad 30a of the LD by removing the second bonding wire 42. That is, the bias current may be supplied to the pad 30a through the third bonding wire 43 and the additional bonding wire. Even in such an alternative arrangement, the pad 30a of the LD is connected to the bias pad 35 on the carrier 31.

The termination pad 36, which is provided on the carrier 31 in a portion closer to the sides, 31e and 31d. The bonding wire 45 connects the termination pad 36 with the pad 30c of the semiconductor modulator, while, a terminator 37 bridges the termination pad 36 with the ground pattern 34. Thus, a signal line for carrying the driving signal is terminated after passing the co-planar line 32 and the semiconductor element 30. The signal line 33 in the co-planar line 32, the ground pattern 34, the bias pad 35, and the termination pad 36 may be formed by plating gold (Au) and includes a titanium (Ti) film, a platinum (Pt) film and a gold (Au) film from the side of the carrier 31, and having thicknesses of 0.1 µm, 0.2 µm, and 3 µm, respectively.

Next, a process of assembling the optical modules, 11a to 11d, will be described as referring to FIGS. 5 to 8 that are perspective views showing respective steps of the assembling process.

Figure 5:
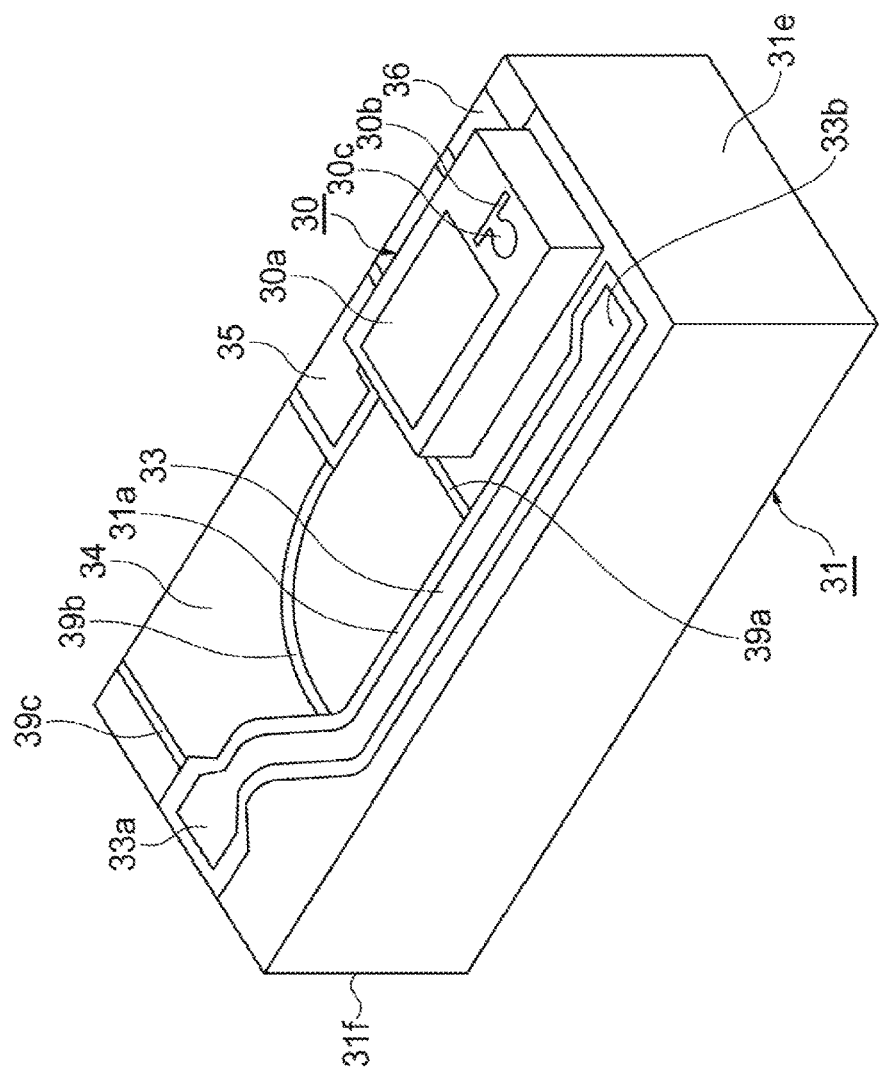
FIG. 5 is a perspective view of the optical module at a step of a process of forming the optical transmitter apparatus.

The process first prepares the carrier 31 on which the co-planar line 32, the ground pattern 34, the bias pad 35, and the termination pad 36 are formed beforehand. The semiconductor element 30 is die-bonded on the ground pattern 34, as shown in FIG. 5, by applying electrically conductive resin on the ground pattern, placing the semiconductor element 30 on the resin, and vaporizing solvents contained in the resin by heating the carrier 30. The back electrode of the semiconductor element 30 may be securely grounded to the ground pattern 34.

Figure 6:
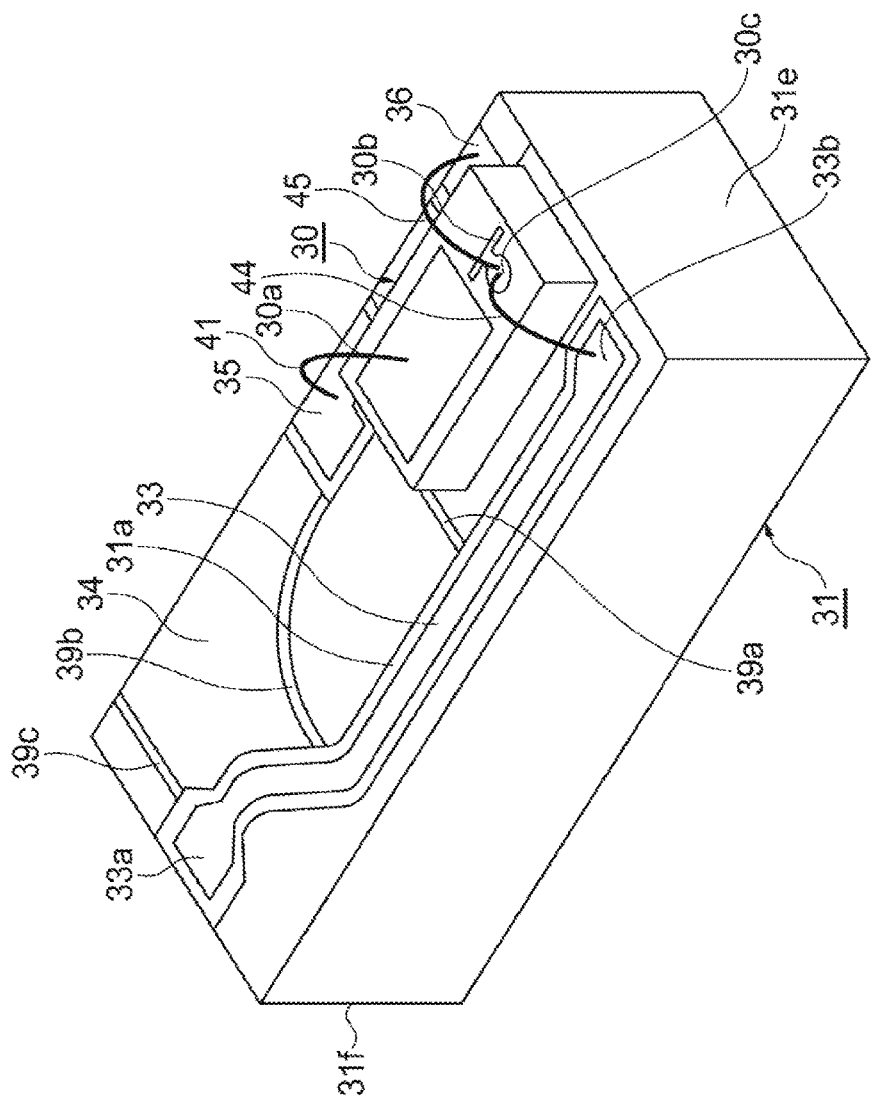
FIG. 6 is a perspective view of the optical module at a step subsequent to the step in FIG. 5.

Then, the bonding wire 41 connects the bias pad 35 with the pad 30a on the semiconductor element 30, the bonding wire 44 connects the end pad 33b of the signal line 33 with the pad 30c, and the bonding wire 45 connects the pad 30c with the termination pad 36, as shown in FIG. 6. The connection of the bonding wires, 41, 44, and 45, may be carried out by the conventional wire-bonding technique, and the order thereof is optional. Thus, an intermediate assembly of the carrier 30 may be completed.

Figure 7:
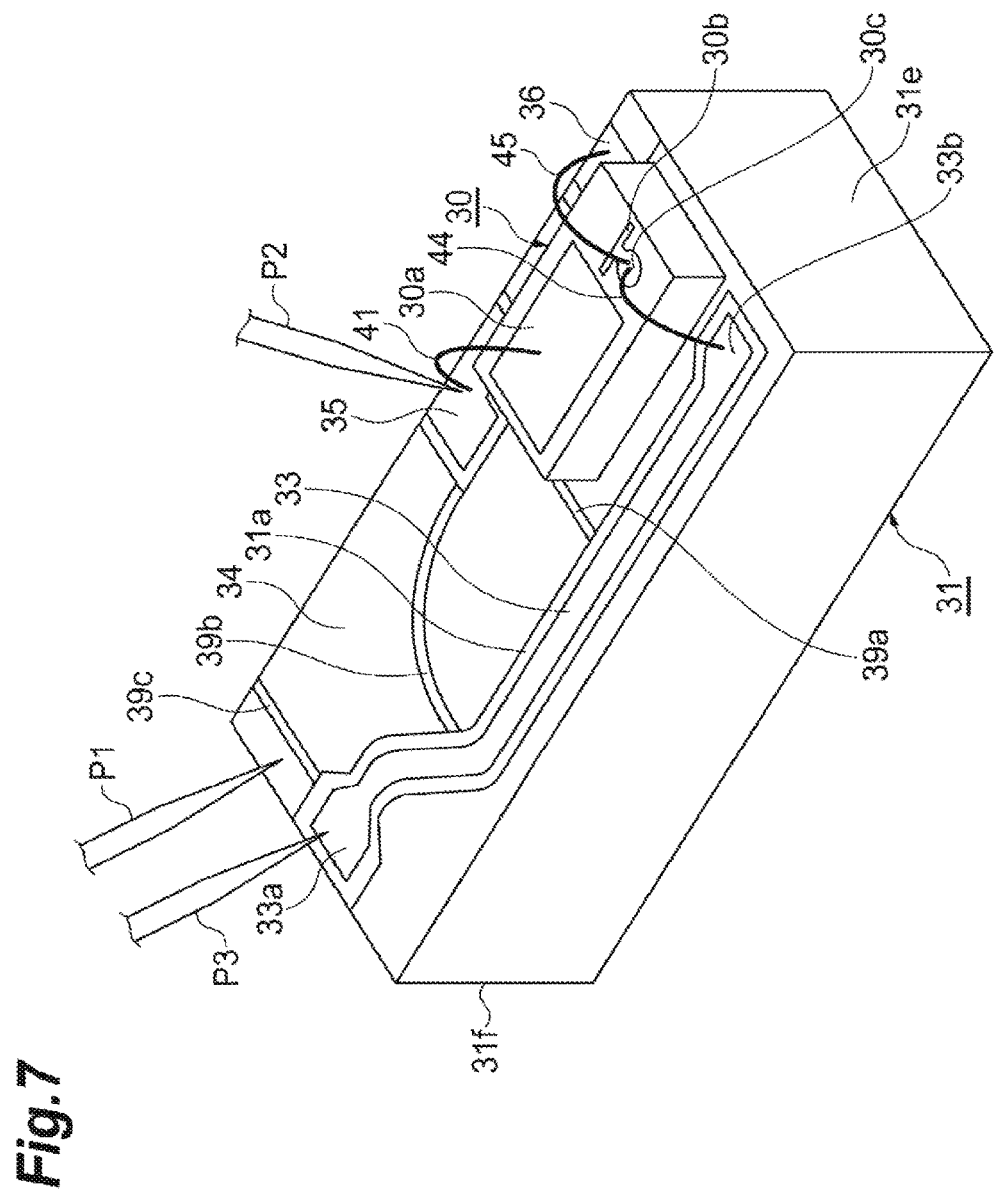
FIG. 7 is a perspective view of the optical module at a step subsequent to the step in FIG. 6.

Then, the process checks the semiconductor element 30. Specifically, proving the ground pattern 34 by a first probe $P_1$ to ensure the ground, proving the bias pad 35 by a second probe $P_2$ to supply the bias current to the LD in the semiconductor element 30, and proving the end pad 33a by a third probe $P_3$ to supply the driving signal to the EA region through the signal line 33, as shown in FIG. 7, the semiconductor element 30 may generate the modulated signal beam. Accordingly, the wavelength, the power, the frequency response, and the like of the semiconductor element 30 may be checked during the assembling process thereof.

Figure 8:
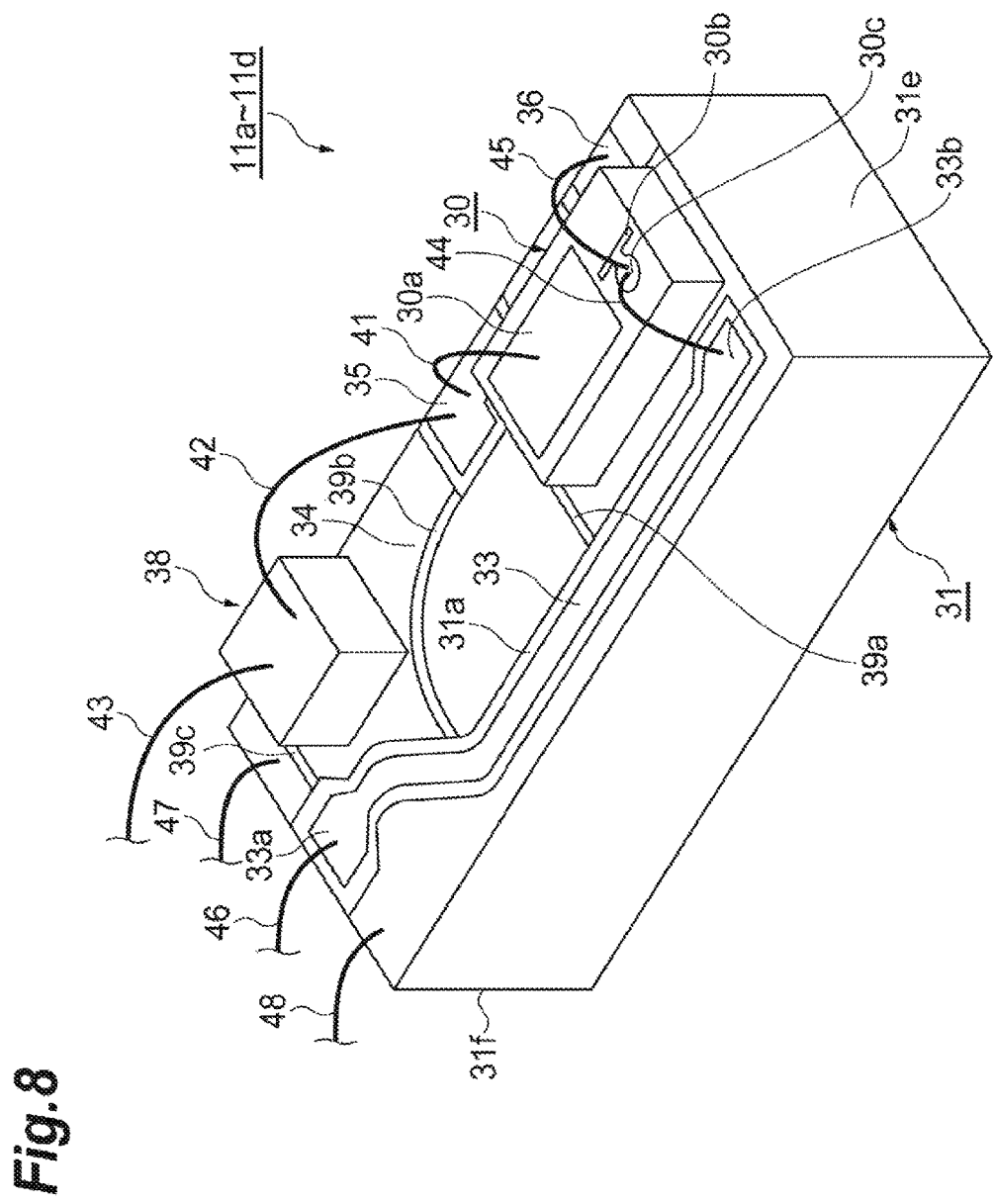
FIG. 8 is a perspective view of the optical module at a step subsequent to the step in FIG. 7.

Then, the capacitor 38 is mounted on the ground patter 34 by the process similar to that for the semiconductor element 30. The bottom electrode of the capacitor 38 may be securely grounded to the ground pattern 34. Thereafter, the top electrode of the capacitor 38 is wire-bonded to the bias pad 35 with the bonding wire 42. Then, the process installs the optical modules, 11a to 11d, thus assembled in the semiconductor elements 30, the capacitors 38, and the bonding wires, 41, 42, 44, and 45, within the housing. After the installation, the pads 33a are wire-bonded to the signal lines 23 provided on the feedthrough 2B with bonding wires 46, the ground patterns 34 are wire-bonded to the ground pattern provided also on the feedthrough 2B with bonding wires, 47 and 48, and the top electrodes of the capacitors 38 are finally wire-bonded to terminals 24 on the feedthrough with the bonding wires 43, as shown in FIG. 8.

Figure 9:
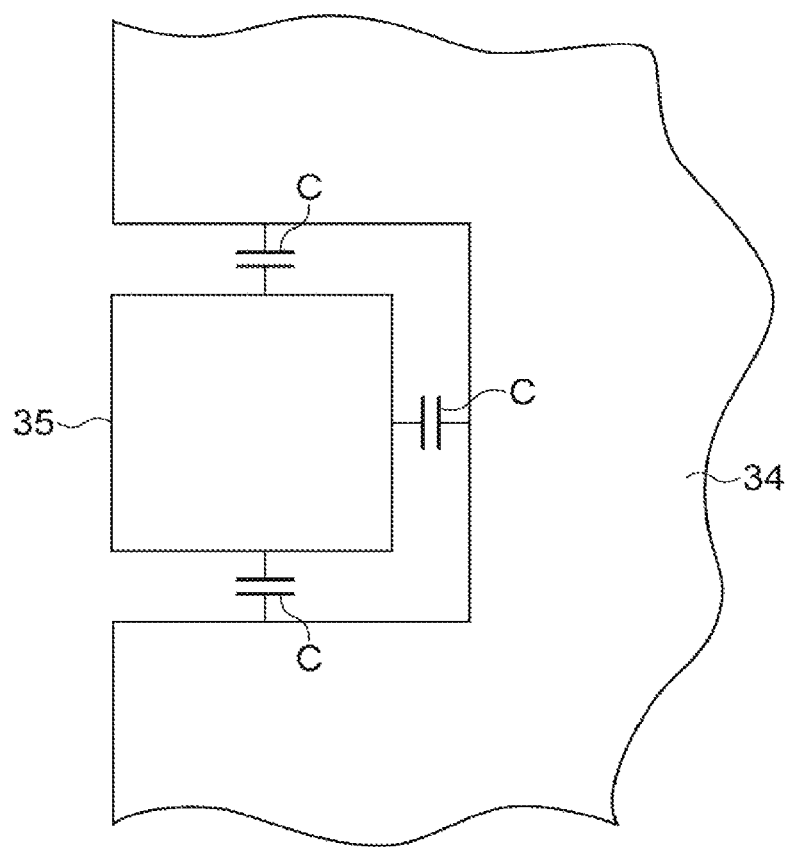
FIG. 9 is a plan view showing a bias pattern and a ground pattern surrounding the bias pattern.

The optical modules, 11a to 11d, thus assembled and installed within the housing 2 provide the carriers 31 with the bias pads 35. The bias pad 35 is electrically isolated from the ground pattern 34 on the carrier 31. The bonding wire 42 electrically connects the capacitors 38, which is also mounted on the carrier 31, with the bias pad 35, and another bonding wire 41 electrically connects the bias pad 35 with the pad 30a on the semiconductor element 30. FIG. 9 schematically illustrates the bias pad 35 and the ground pattern 34 surrounding the bias pad 35. As shown in FIG. 9, the bias pad 35 inevitably accompanies with parasitic capacitor against the ground pattern 34 whose capacitance depends on a peripheral length of the bias pad 35.

Figure 10:
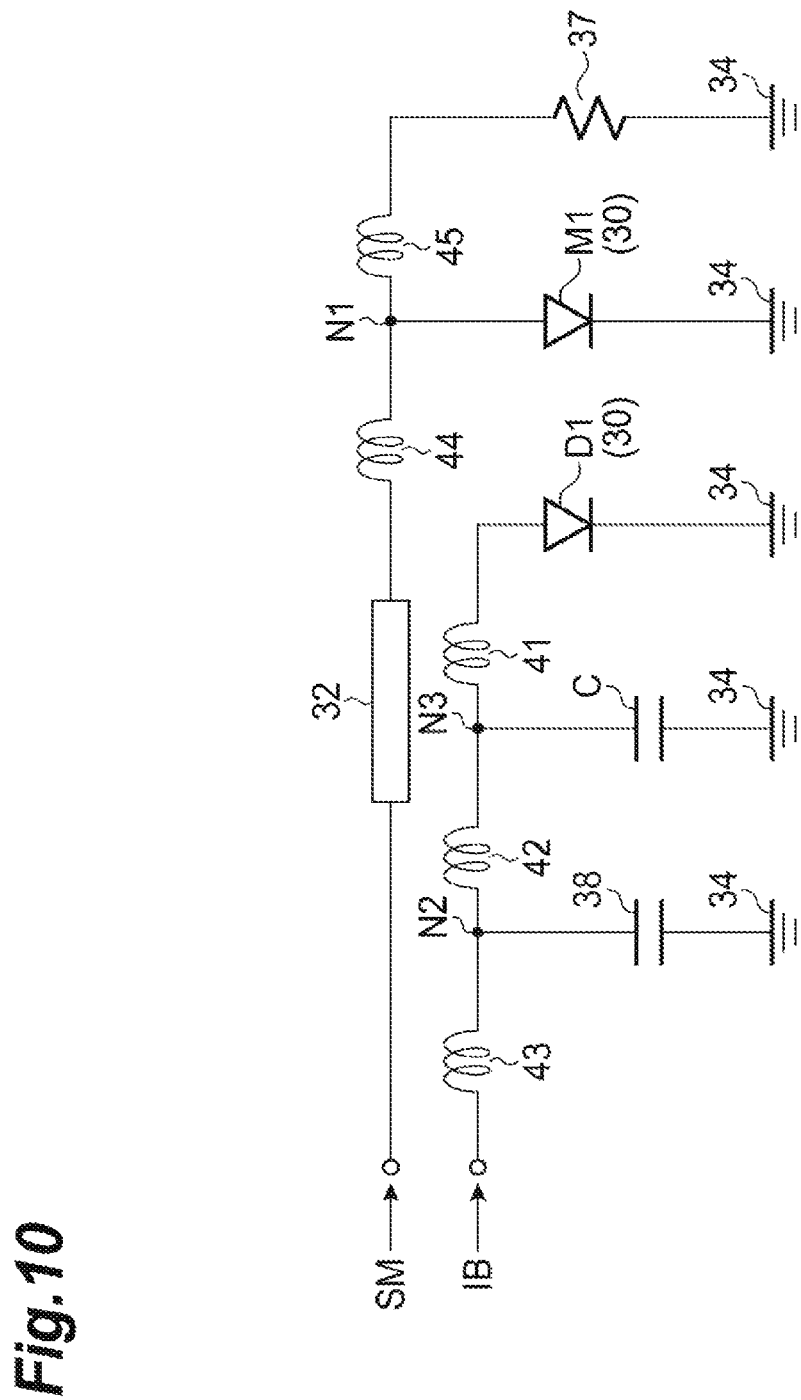
FIG. 10 shows an equivalent circuit diagram of the optical module.

FIG. 10 shows an equivalent circuit diagram of the optical module, 11a to 11d. The optical module 11a receives the driving signal SM in the optical modulator $M_1$ through the bonding wire 44 and the co-planar line 32. The node $N_1$ in FIG. 10 corresponds to the pad 30c on the semiconductor element 30, which is grounded through the bonding wire 45 and the terminator 37. The cathode of the semiconductor modulator $M_1$, which is the back surface of the semiconductor element, is also grounded. On the other hand, the anode of the LD $D_1$ receives the bias current IB through the bonding wires, 41 to 43. The node $N_2$ corresponds to the top electrode of the capacitor 38, and grounded through the capacitor 38. While the node $N_3$ corresponds to the bias pad 35 that operates as the parasitic capacitor C.

Figure 11:
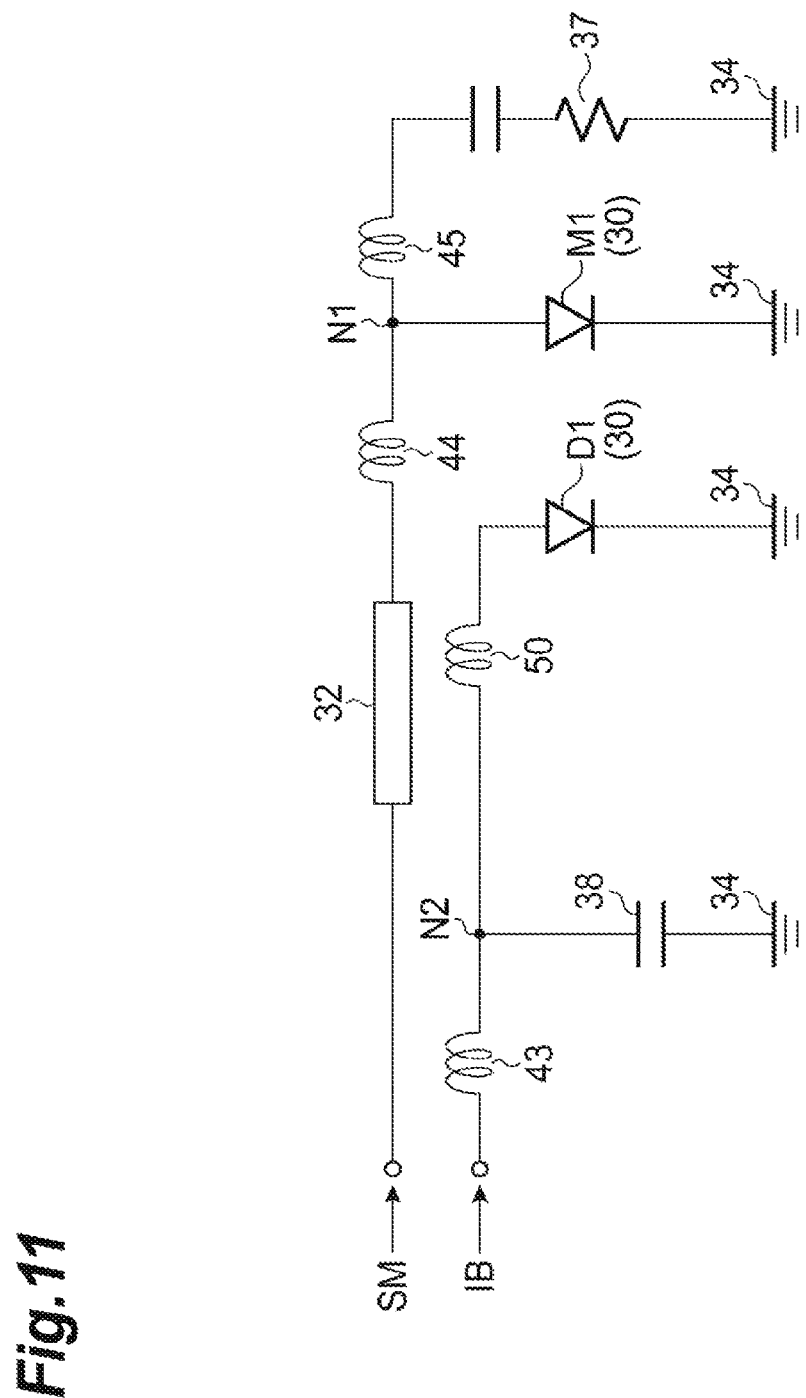
FIG. 11 shows an equivalent circuit diagram comparable to that shown in FIG. 10 of the present embodiment.

FIG. 11 also shows an equivalent circuit diagram of an optical module that has no bias pad on the carrier, where the pad 30a on the semiconductor element 30 is connected to the capacitor 38 with a bonding wire 50. Because no bias pad is found on the carrier 31, elimination of noises is restricted. That is, the parasitic capacitor attributed to the bias pad 35 may effectively suppress noises in higher frequencies. Mounting another capacitor with capacitance corresponding to that of the parasitic capacitor, the carrier 31 is necessary to be enlarged for securing a space for additional capacitor.

The bias pad 35 of the present embodiment may show a function of a bypassing capacitor to eliminate noise components in higher frequencies. Parasitic capacitor generally shows capacitance smaller than that of a substantial capacitor. Accordingly, the parasitic capacitance C may suppress noises with frequencies higher than frequencies attributed to the capacitance of the capacitor 38. Thus, the capacitor 38 may suppress noises in relatively lower frequencies, while, the bias pad 35 in the parasitic capacitance thereof may suppress noises in relatively higher frequencies. Moreover, the carrier 30 is unnecessary to secure a space for mounting additional capacitors, which may make the housing 2 small and avoid increment of the parts count.

An additional bonding wire may connect the capacitor 35 directly with the pad 30a on the semiconductor element 30 as leaving the bonding wire 42 from the capacitor 38 to the bias pad 35 and the bonding wire 41 from the bias pad 35 to the pad 30a. The additional bonding wire may secure a path for supplying the bias current to the semiconductor element 30 as leaving the parasitic capacitance C around the bias pad 35.

Also, in an alternative arrangement above described, the bonding wire 42 connecting the bias pad 35 with the capacitor 38 may be removed. Even in such an arrangement, the bias current may be securely supplied to the semiconductor element 30 through the bonding wire 43 and the additional bonding wire from the capacitor 38 to the pad 30a on the semiconductor element 30; while, the parasitic capacitance C may be left viewed from the semiconductor element 30. Thus, the noise reduction by the parasitic capacitance attributed to the bias pad 35 may be securely maintained.

From a viewpoint of the process for assembling the optical module 11a, the inspection of the semiconductor element 30 during the production becomes hard for the arrangement without the bias pad 35, because supplement of the bias current to the pad 30a of the semiconductor element 30 by proving becomes impossible no longer. The inspection of the optical modules becomes possible after the installation thereof within the housing 2 and the performance of the wire-bonding. However, in such an arrangement, even when only one of the optical modules becomes failure, a whole of the optical transmitter apparatus has to be dropped from the subsequent production. The inspection of the optical module independently by proving the bias pad according to the present embodiment becomes effective.

Modification

Figure 12:
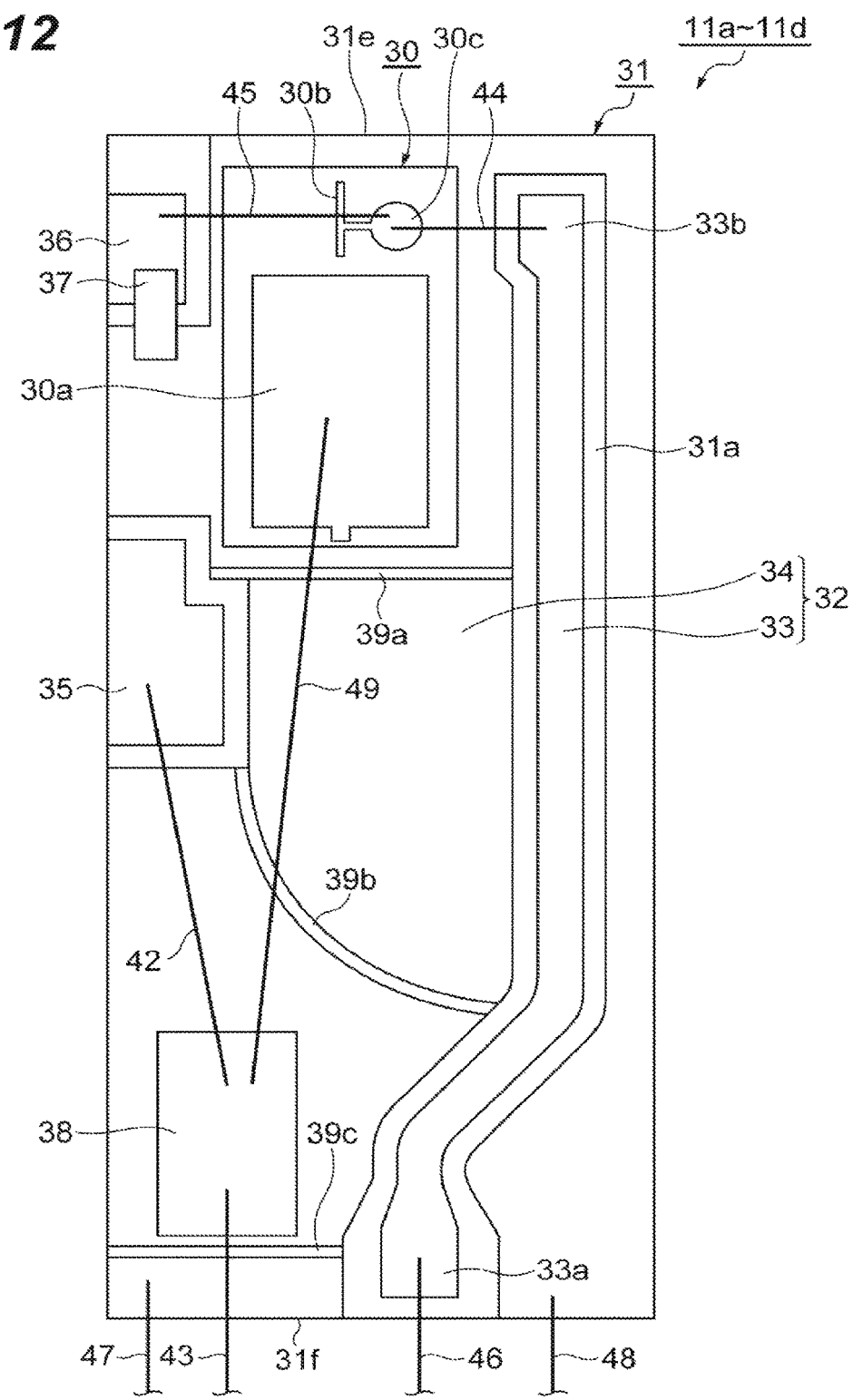
FIG. 12 is a plan view showing another optical module that is modified from the embodiment shown in FIG. 2.
Figure 13:
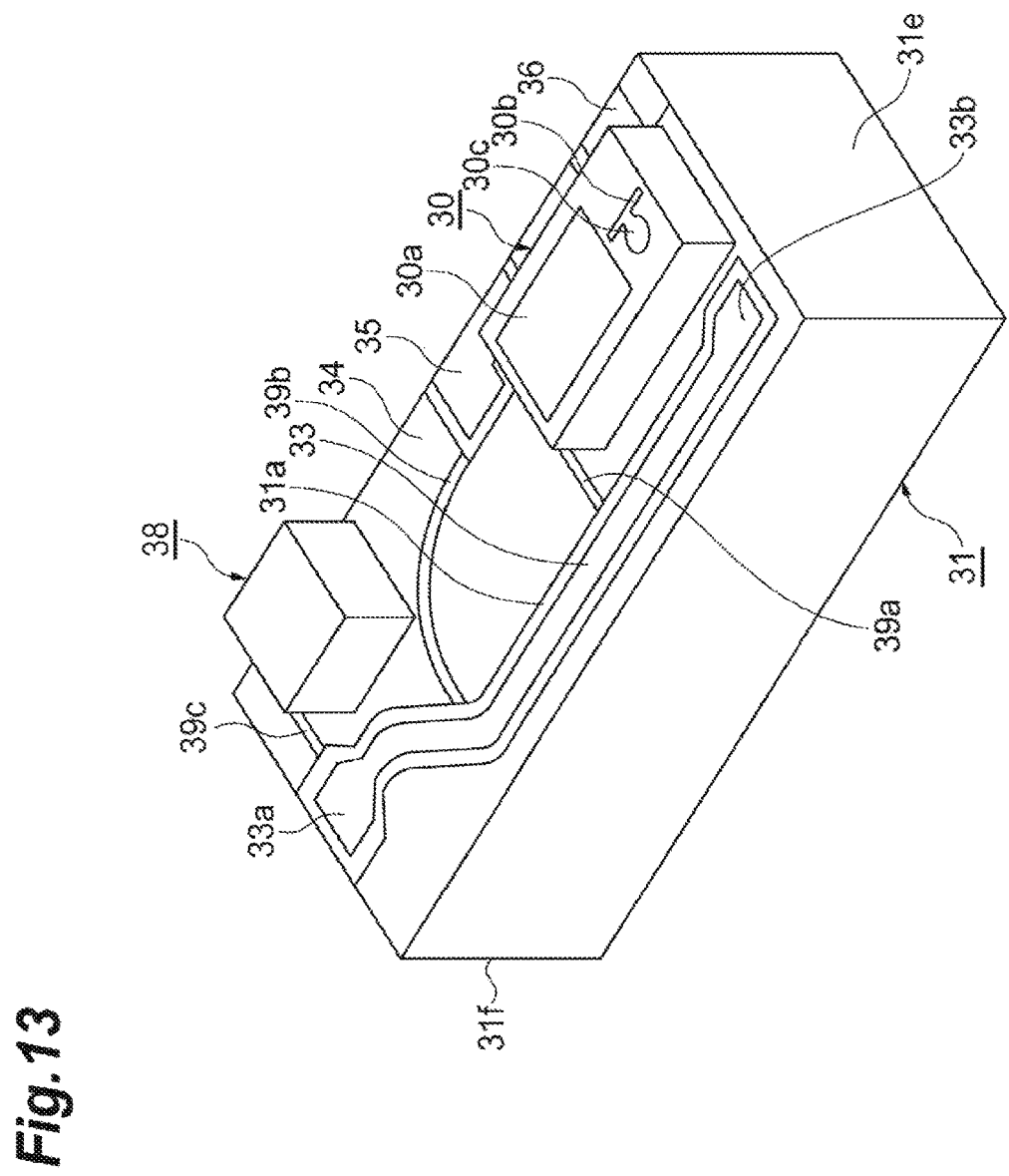
FIG. 13 is a perspective view of the modified optical module shown in FIG. 12 at a process of forming thereof.

Next, a modification of the optical module according to the first embodiment will be described. FIG. 12 is a plan view showing another optical module according to the modification of the first embodiment. The modified optical module shown in FIG. 12 has an arrangement of the bonding wires distinguishable from those of the first embodiment. That is, the first bonding wire 41 in the first embodiment connects the bias pad 35 with the pad 30a on the semiconductor element 30, while, the modification shown in FIG. 12 removes this first bonding wire 41 but provides another bonding wire 49 connecting the capacitor 38 with the pad 30a.

FIGS. 13 to 16 are perspective vies showing steps of assembling the optical module, 11a to 11d.

The process first prepares the carrier 30 that provides the co-planar line 32, the ground pattern 34, the bias pad 35, and the termination pad 36 thereon, and the semiconductor element 30 and the capacitor 38 are mounted by electrically conductive resin on the ground pattern 34 beforehand. Thus, the back electrode of the semiconductor element 30 and that of the capacitor 38 are securely grounded to the ground pattern 34.

Figure 14:
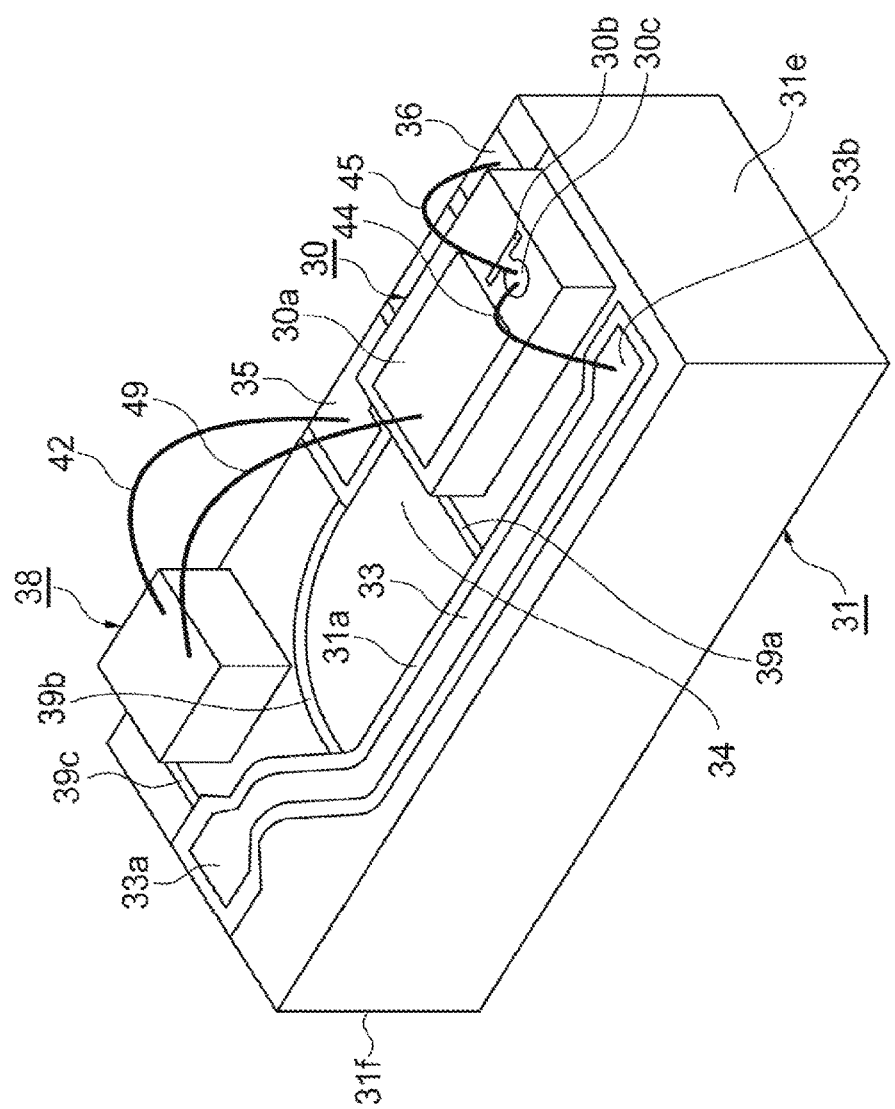
FIG. 14 is a perspective view of the modified optical module at a process subsequent to that shown in FIG. 13.

Then, as shown in FIG. 14, the capacitor 38 is wire-bonded to the bias bad 35 with the bonding wire 42 and to the pad 30a on the semiconductor element 30 with the bonding wire 49, while, the pad 30c on the semiconductor element 30 is wire-bonded to the signal line 33 with the bonding wire 44 and to the termination pad 36 with the bonding wire 45. The order of the wire-bonding for the bonding wires, 42, 44, 45, and 49, is optional. Thus, the process of assembling the optical module, 11a to 11d, forms an intermediate assembly.

Figure 15:
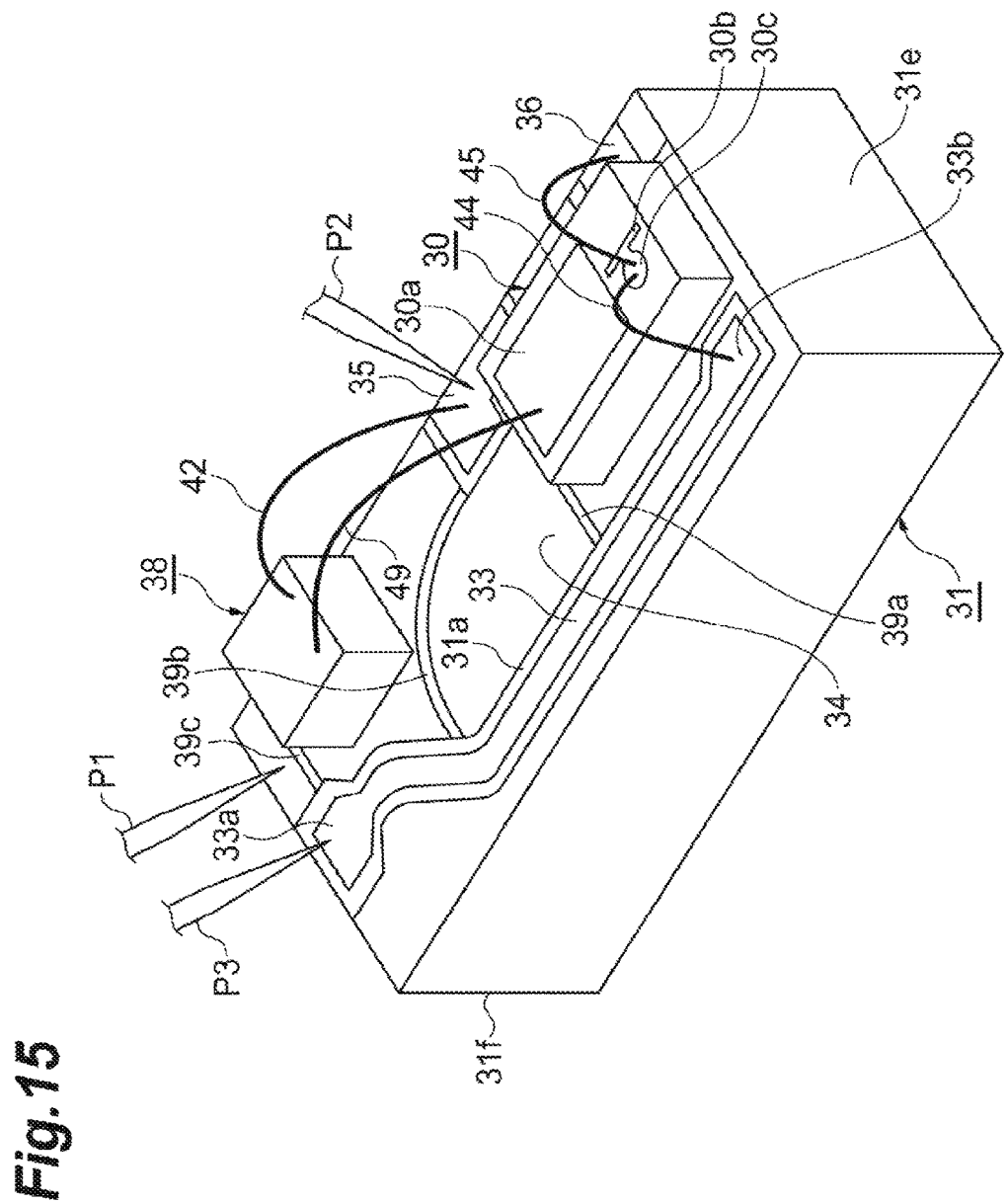
FIG. 15 is a perspective view of the modified optical module at a process subsequent to that shown in FIG. 14.

Then, the semiconductor element is practically inspected by supplying the bias current and the driving signal. That is, as shown in FIG. 15, proving the ground pattern 34 by the probe $P_1$ to secure the ground potential, proving the bias pad 35 by the prove $P_2$ to supply the bias current, and proving the signal line 33 by the probe $P_3$ to supply the driving signal, as shown in FIG. 15, the semiconductor element 30 may output the modulated signal beam. The wavelength, the optical power, the frequency response, or the like of the modulated signal beam may be practically inspected. When at least one of the inspections causes a failure, such an optical module is removed from the subsequent production.

Figure 16:
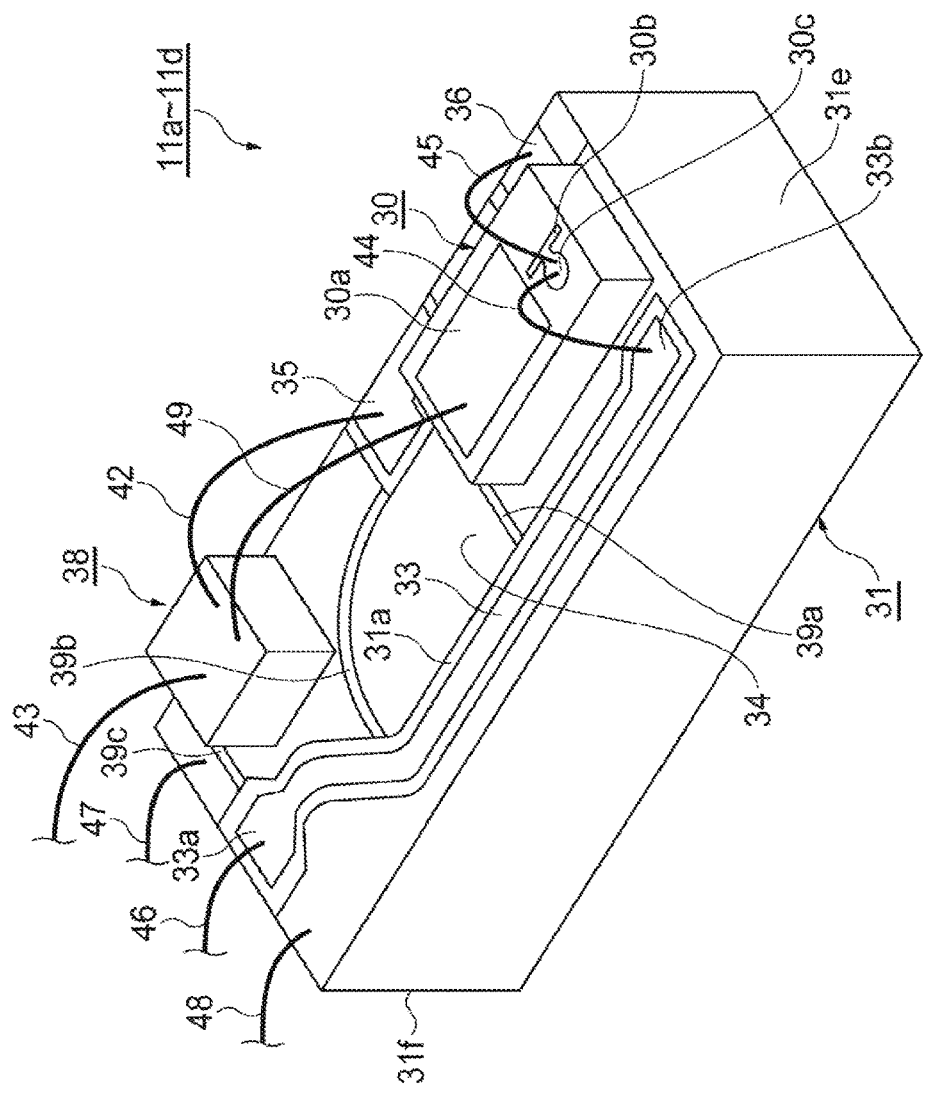
FIG. 16 is a perspective view of the modified optical module at a process subsequent to that shown in FIG. 15.

Thereafter, the optical module passing the inspection above is installed within the housing 2. As FIG. 16 illustrates, the bonding wire 46 connects the signal line 33 with the signal line 23 on the feedthrough 2B, the bonding wires, 47 and 48, connect the ground pattern 34 with the ground pattern also on the feedthrough 2B, and the bonding wire 43 connects the capacitor 38 with the terminal 24 on the feedthrough 2B.

Figure 17:
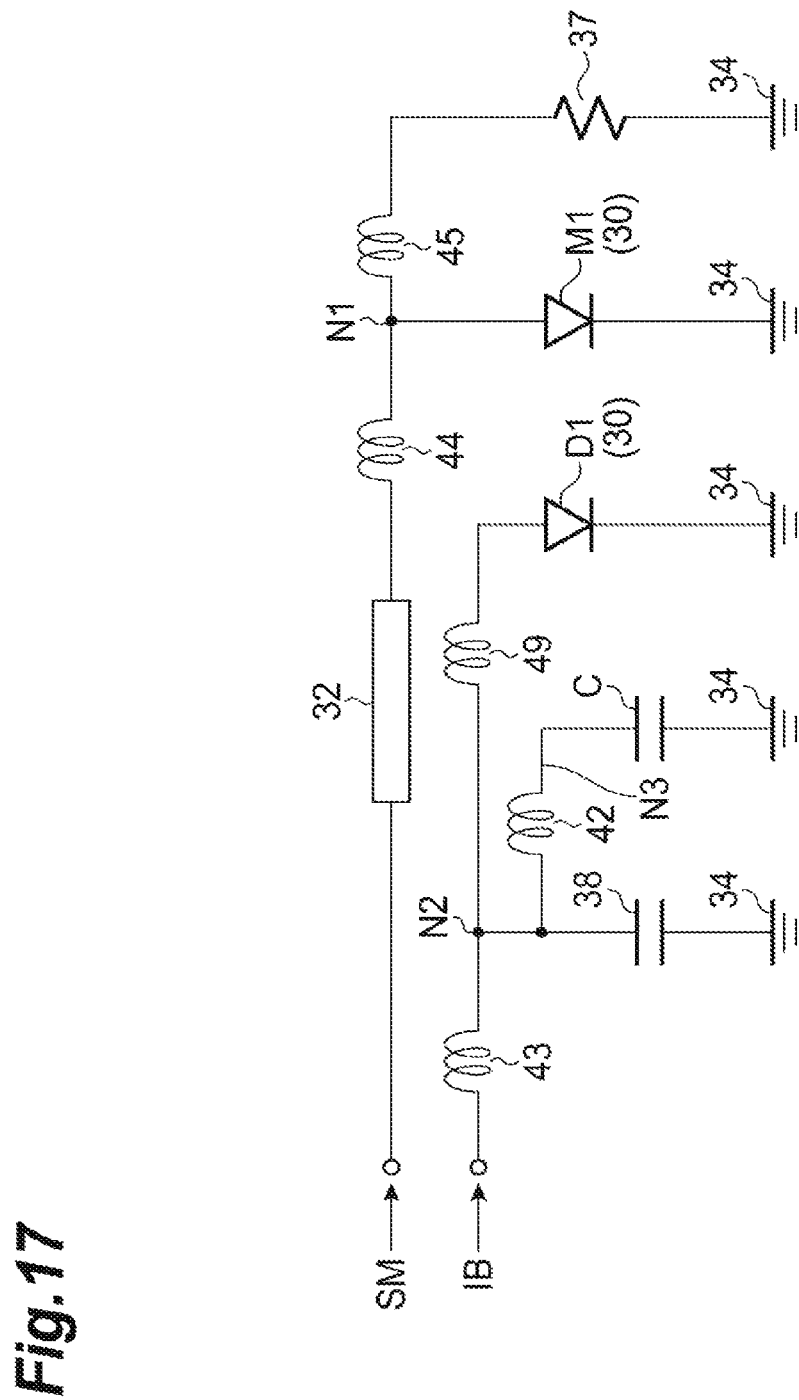
FIG. 17 shows an equivalent circuit diagram of the modified optical module shown in FIG. 12.

The modified optical module thus described provides the carrier 30 with the bias pad 35 causing parasitic capacitance against the ground pattern 34. The bonding wire 42 connects the bias pad 35 with the capacitor 38, while, another bonding wire 49 connects the capacitor 38 with the pad 30a on the semiconductor element 30. FIG. 17 shows an equivalent circuit diagram for the modified arrangement shown in FIG. 12. The anode of the LD $D_1$ receives the bias current IB through the bonding wires, 43 and 49. The node $N_2$ corresponds to the capacitor 38 and grounded through the capacitor. The node $N_3$ corresponds to the bias pad 35 and grounded through the parasitic capacitance C.

The parasitic capacitance C in FIG. 17 may effectively suppress noises in relative higher frequencies; while, the capacitor 18 may suppress noises in relatively lower frequencies. Thus, the capacitor 38 and the parasitic capacitor C may be operable in complementary. The optical module, 11a to 11d, may suppress noises contained in the bias current without installing additional capacitors. Also, because of the existence of the bias pad 35, the inspection during the production of the optical module, 11a to 11d, may be easily carried out.

In the foregoing detailed description, the process of assembling the optical module according to the present invention have been described with reference to specific exemplary embodiment thereof. It will, however, be evident that various modifications and changes may be made thereto without departing from the broader spirit and scope of the present invention. For instance, the optical transmitter apparatus thus described implements four (4) optical modules whose arrangements are substantial identical from each other. However, the optical transmitter apparatus may implement less than four (4) optical modules, or more than four (4) optical modules. Accordingly, the present specification and figures should be regarded as illustrative rather than restrictive.

What is claimed is:

1. An optical module that generates a modulated optical beam, comprising:
    an electrically insulating carrier that provides a ground pattern and a bias pad on a top surface thereof, the bias pad being electrically isolated from the ground pattern thereby forming a parasitic capacitor against the ground pattern;
    a semiconductor element mounted on the ground pattern, the semiconductor element generating the modulated optical beam by being supplied with a bias current;
    a capacitor mounted on the ground pattern; and
    at least two bonding wires among a first bonding wire connecting the semiconductor element with the bias pad, a second bonding wire connecting the bias pad with the capacitor, and an additional bonding wire connecting the capacitor with the semiconductor element,
    wherein the capacitor and the parasitic capacitor are operable in complementary with respect to frequencies, and
    wherein the bias current is supplied to the semiconductor element from the capacitor through the at least two bonding wires.

2. The optical module of claim 1, wherein the bias current is supplied through the first bonding wire and the second bonding wire by removing the additional bonding wire.

3. The optical module of claim 1, wherein the bias current is supplied through the additional bonding wire by removing the first bonding wire but leaving the second bonding wire.

4. The optical module of claim 1, wherein the bias current is supplied through the additional bonding wire by removing the second bonding wire but leaving the first bonding wire.

5. The optical module of claim 1, wherein the capacitor has a type of die-capacitor having a top electrode and a back electrode, the top electrode being wire-bonded with the second bonding wire and the additional bonding wire, the back electrode being in contact with the ground pattern.

6. The optical module of claim 1, wherein the semiconductor element provides a back metal connected to the ground pattern and a pad in a top surface thereof, the pad being wire bonded with the bias pad with the first bonding wire and with the capacitor with the additional bonding wire.

7. The optical module of claim 1, wherein the carrier further provides a co-planar line with a signal line surrounded by the ground pattern, the signal line being wire-bonded to the semiconductor element through a bonding wire.

8. The optical module of claim 7, wherein the carrier further provides a termination pad that is wire-bonded to the semiconductor element with a bonding wire, the termination pad being grounded through a terminator.

9. An optical transmitter apparatus that generates a multiplexed optical beam, comprising:
    a number of optical modules each including,
        an electrically insulating carrier that provides a ground pattern and a bias pad on a top surface thereof, the bias pad being electrically isolated from the ground pattern thereby forming a parasitic capacitor against the ground pattern,
        a semiconductor element mounted on the ground pattern, the semiconductor element generating a modulated optical beam supplied with a bias current thereto,
        a capacitor mounted on the ground pattern, and
        at least two bonding wires among a first bonding wire connecting the semiconductor element with the bias pad, a second bonding wire connecting the bias pad with the capacitor, and an additional bonding wire connecting the capacitor with the semiconductor element,
        wherein the bias current is supplied to the semiconductor element from the capacitor through the at least two bonding wires; and
    an optical multiplexing system that multiplexes the modulated optical beams generated in the optical modules into the multiplexed optical beam,
    wherein the number of the optical modules is four (4), and
    wherein the optical multiplexing system includes four first lenses, a beam splitter, four second lenses, two wavelength selective filters, and a polarization beam combiner, the first lenses concentrating the modulated beams output from the optical modules into four concentrated beams, the beam splitter splitting the four concentrated beams into four monitored beams and four signal beams, the second lenses converting the four signal beams into four collimated beams, the wavelength selective filters multiplexing two of the four signal beams and generating two multiplexed beams, the polarization beam combiner multiplexing the two multiplexed beams depending on polarizations thereof into the multiplexed optical beam output from the optical transmitter apparatus.

* * * * *